United States Patent [11] 3,588,612

[72] Inventors Douglas B. Leathem
Wayland;
Raymond A. Jones, Saugus; Walter F. Pope, Cambridge, Mass.
[21] Appl. No. 736,451
[22] Filed June 12, 1968
[45] Patented June 28, 1971
[73] Assignee United-Carr Incorporated
Boston, Mass.

[54] SOLID STATE LAMP FLASHER
2 Claims, 1 Drawing Fig.

[52] U.S. Cl. .... 317/33R, 307/202
[51] Int. Cl. .... H02h 9/02, H02h 9/04
[50] Field of Search .... 307/202; 317/31, 33

[56] References Cited
UNITED STATES PATENTS

| | | | |
|---|---|---|---|
| 2,971,102 | 2/1961 | Schultz | 307/202X |
| 3,048,718 | 8/1962 | Starzec et al. | (317)/(31UX) |
| 3,083,303 | 3/1963 | Knowles et al. | 307/202X |
| 3,293,495 | 12/1966 | Smith | 317/33X |
| 3,366,871 | 1/1968 | Connor | 317/33X |
| 3,411,039 | 11/1968 | Moulton | 317/33 |
| 3,473,106 | 10/1969 | Grabl | 317/33X |

*Primary Examiner*—William M. Shoop, Jr.
*Attorneys*—Philip E. Parker, Gordon Needleman, James R. O'Connor, John Todd and Hall and Houghton

ABSTRACT: This is a solid state lamp flasher circuit which has diode and transistor means as a short circuit protection and also protects the power stage of the circuit from excessive transient voltages by using a diode to turn the power stage on. A diode is also used to turn the power stage on where reverse polarity conditions exist protecting that portion of the circuit against partial turnon.

PATENTED JUN 28 1971 3,588,612
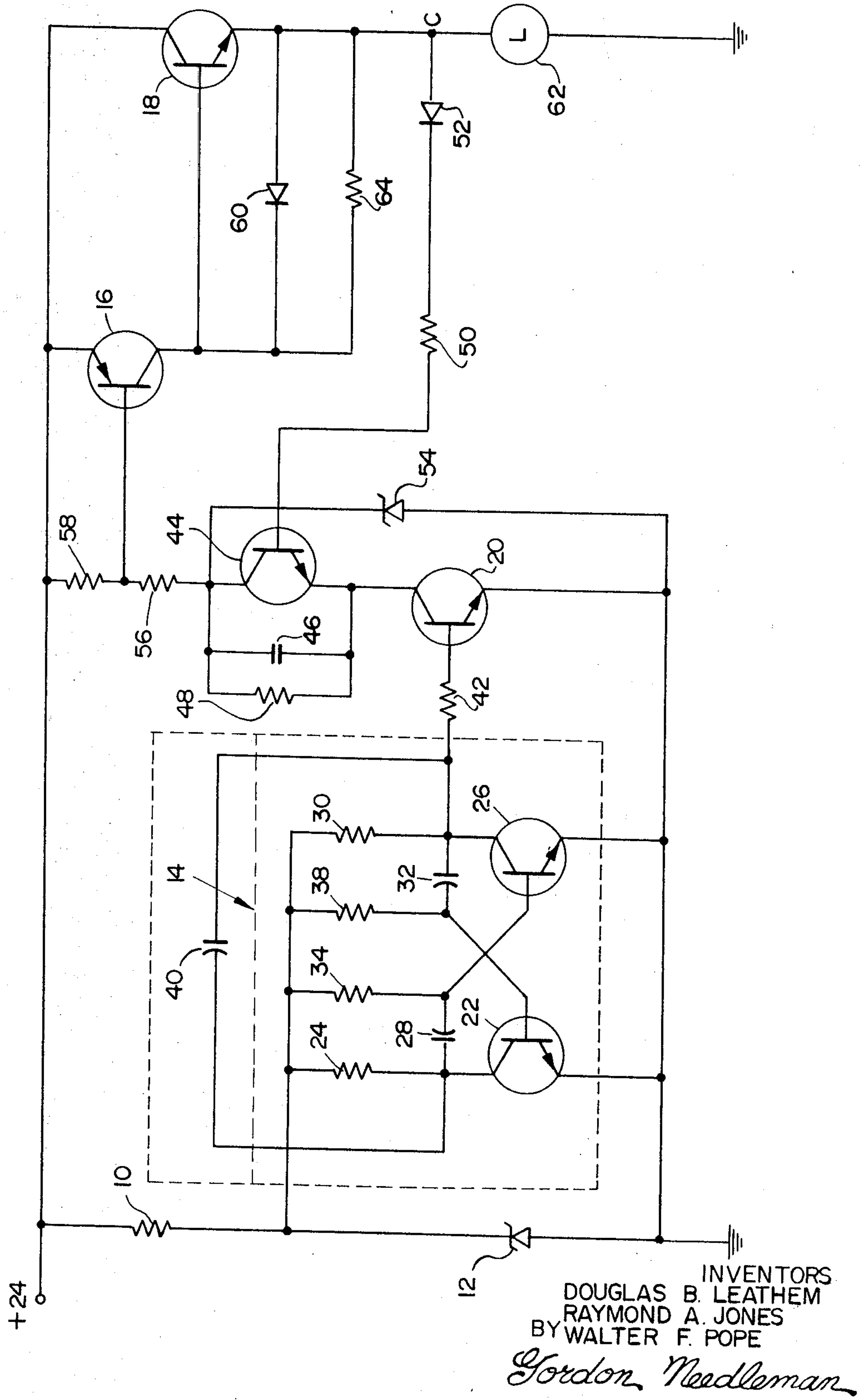
INVENTORS
DOUGLAS B. LEATHEM
RAYMOND A. JONES
WALTER F. POPE
BY
Gordon Needleman
ATTORNEY

SOLID STATE LAMP FLASHER

BACKGROUND OF THE INVENTION

Solid state circuits in particular need protection against excessive currents or voltages which may be impressed on the circuit. As is well known in the art most solid state devices for example transistors once subjected to excessive currents will drive themselves to destruction even though the excessive current has ceased. Electromechanical circuit breakers due to the weight and inertia of their moving parts do not usually respond quickly enough to protect transistorized circuits.

Mechanical relays are quite expensive, erratic in operation and too slow in their response to provide adequate protection.

Fuses are also unsatisfactory because of the time lag between the application of the destructive signal and the operation of the fuse which is usually enough for the signal to destroy the transistor which was to be protected.

The use of zener diodes alone which have been connected to limit electrical voltages to the breakdown voltage of the diode is not satisfactory if the applied transient power is sufficient to burn out the diode.

SUMMARY OF THE INVENTION

In the inventors' circuit which can be used in a vehicle the amplifier or high energy switching stage is protected from a short circuit occurring at the load by a transistor which is turned on only when the combined breakdown voltage of a trigger diode and the emitter base voltage of the transistor is exceeded. If the breakdown voltage is not maintained or exceeded the transistor will be turned off thus turning off the amplifier stage. A capacitor across the transistor is used to initially turn the amplifier stage on and is also used to turn it on after a short circuit has occurred and been corrected.

The inventors have provided protection for one of the transistors of the power stage from a destructive partial turn-on during reversed polarity conditions by connecting a diode between the emitter and the base of the transistor. This diode assures under reversed polarity conditions that the transistor will be fully turned on thereby avoiding the dangers of a partial turn-on.

The inventors also protect the power stage from excessive transient voltages by turning it on fully using a zener diode.

BRIEF DESCRIPTION OF THE DRAWING

FIG. 1 is a schematic showing the major portion of the novel circuit.

DESCRIPTION OF THE PREFERRED EMBODIMENT

A DC power supply such as an automobile battery having a variable voltage from 18 to 30 volts is connected to a resistor 10 which is in series with a zener diode 12. The zener diode 12 is connected to ground and with the resistor 10 acts as a stabilizing circuit for the voltage applied to the astable or free-running multivibrator system 14. In effect the resistor 10 and the voltage regulating zener diode 12 comprise a voltage divider. The stabilizing circuit provides a constant flashing rate over the voltage range of the power supply. Although the inventors have shown an astable multivibrator there is no reason why a bistable or monostable multivibrator system could not be used although the end function of the circuit would be different. In fact almost any type of switching circuit could be substituted if desirable. The multivibrator system 14 is coupled to a modified Darlington amplifier stage comprising the transistors 16 and 18 through the isolating transistor 20.

The astable multivibrator system 14 comprises a first transistor 22 having its emitter at ground and having its collector reversed biased by the load resistor 24. The collector of the first transistor 22 is coupled to the base of the second multivibrator transistor 26 through the first coupling capacitor 28. The emitter of the second multivibrator transistor 26 is at ground potential and its collector is biased by the load resistor 30 in series therewith and is coupled to the base of the first multivibrator transistor 22 through the coupling capacitor 32. The coupling network of the first multivibrator transistor 22 comprises the first coupling capacitor 28 and the bias resistor 34 while the coupling network for the second multivibrator transistor 26 comprises the second coupling capacitor 32 and the bias resistor 38. As is well known in the art the length of time which each stage of the multivibrator conducts depends on the RC time contact of the first coupling capacitor 28 and the resistor 34 and the second coupling capacitor 32 and the resistor 38. Since no two transistors are the same let us assume that the first multivibrator transistor 22 starts conducting first. Its collector voltage will lower faster than that of the second multivibrator transistor 26 causing a decrease in the conduction of the second multivibrator transistor 26 with an increase in its collector voltage. The rise in the collector voltage of the second multivibrator transistor 26 is coupled back to the base of the first multivibrator transistor 22 driving it to saturation while the second multivibrator transistor 26 is being driven to cutoff. Once the respective saturation and cutoff have been reached this condition until the first coupling capacitor 28 discharges sufficiently to allow the base of the second multivibrator transistor 26 to rise above cutoff at which time the second multivibrator transistor 26 begins conducting and starts the second half of the switching cycle. Since the flasher is designed for a vehicular environment the device must have a high degree of electrical noise immunity. This immunity is derived from zener diode 12 and capacitor 40 which protect the waveform generating multivibrator 14. The zener action of the diode 12 attenuates positive noise pulses very effectively. Negative noise pulses are also attenuated by selecting a zener whose breakdown voltage is a small percentage of the supply voltage. For example if the supply voltage is 18 volts then a 6-volt zener will effectively attenuate all negative noise pulses whose magnitude is less than approximately 12 volts. Capacitor 40 is used to protect the multivibrator from larger negative noise pulses. Such a pulse tends to preferentially turn off that transistor which is currently on. Regenerative action then causes the transistor which was off to turn on. The net result is erratic flashing due to electrical noise. When capacitor 40 is added to the circuit any negative noise pulse appearing at the collector of the off transistor is shunted to ground through capacitor 40 and the currently on transistor. Furthermore since both transistor collectors are joined by capacitor 40 any noise regeneration will be effectively decoupled by the capacitor 40. Although capacitor 40 will tend to slow down the switching speed of the multivibrator 14 this is not important in the present application. As mentioned heretofore the multivibrator system 14 is coupled to the power amplifier system through the isolation transistor 20 which has a current limiting resistor 42 in series with it and between it and the multivibrator system 14. Isolation transistor 20 acts as a buffer between the low level signal of the multivibrator and the power circuit consisting of transistors 16 and 18. Transistor 20 could be eliminated by increasing the power output of the multivibrator. Significant economy is realized however by reducing the size of tantalum capacitors 28 and 32 and adding the active element, transistor 20. The emitter of the isolating transistor 20 is at ground potential and the collector is connected to the emitter of the transistor 44 which is part of the short circuit protective network.

As a protection for the power amplifier stage against excessive transient voltages a voltage breakdown device such as a zener diode 54 is connected to ground and also connected to the base of the first power transistor 16 of the amplifier stage through current regulating resistor 56. When a transient voltage is impressed on the circuit which is above the clamping voltage of the zener diode 54 it immediately turns on the power transistors 16, 18 and is shunted to ground through the load 62. By turning the transistors 16, 18 on they are protected from damage. The current regulating resistor 56 is placed in series with the collector of the transistor 44 and the base of the first power transistor 16. The emitter bypass resistor 58 is connected between the emitter and the base of the transistor 16. This resistor reduces transistor leakage currents of the first power transistor 16 at high temperatures.

When polarity is reversed the transistor 18 behaves as a low gain virtual transistor with a virtual emitter at its collector and a virtual collector at its emitter. Under these conditions zener diode 60 provides a large base current to drive virtual transistor 18 into saturation thus protecting transistor 18 from excessive power dissipation due to a partial turn-on which would occur without the diode 60. The diode 60 will thus protect the power amplifier stage from burnout caused by accidental reversal of the 24-volt battery for example.

The short circuit protective network comprises the shunt capacitor 46, the bleeder resistor 48, the base current determining resistor 50, the trigger diode 52 and the transistor 44.

The short circuit protective network utilizes the shunt capacitor 46 which provides an instantaneous shunt around the transistor 44. The shunt capacitor 46 by shunting the transistor 44 allows current to flow and the power amplifier stage to be turned on. As soon as the voltage at point C exceeds the combined breakdown voltage of the trigger diode 52 and the emitter base voltage of the transistor 44 it will turn on. When the transistor 44 has been turned on the power amplifier stage will remain on. Should the voltage at point C fail to reach the required breakdown voltage due to a short circuit at the load 62 the transistor 44 will not turn on and the shunt capacitor 46 will cease conducting current at an exponential rate which is determined by the time constant of the shunt capacitor 46 and the current regulating resistor 56. Under these latter circumstances the power amplifier stage will turn off. The bleeder resistor 48 will bleed the capacitor 46 when the short circuit is removed thus automatically restarting the system. The resistor 64 is an emitter bypass resistor for the transistor 18 and has a function similar to the resistor 48.

The inventors' system may be described in simple terms as a low energy switch comprising the astable multivibrator which provides input to a high energy switch comprising the amplifier stage.

I claim:

1. A switching circuit comprising a multivibrator providing a low energy switching means coupled to a high energy switching means through an isolation transistor, said circuit having a short circuit protective network for the high energy switching means comprising a capacitor in parallel with a transistor, the transistor connected to the first element of the high energy switching means and a trigger diode in series with a resistor both connected to the last element of the high energy switching means and the transistor.

2. A switching circuit as set forth in claim 1 wherein said multivibrator is astable and wherein the transistor of the short circuit protective network is connected between the collector of the isolation transistor and the base of the first transistor of the high energy switch.

UNITED STATES PATENT OFFICE
CERTIFICATE OF CORRECTION

Patent No. 3,588,612  Dated June 28, 1971

Inventor(s) Douglas B. Leathem, Raymond A. Jones and Walter F. Pope

It is certified that error appears in the above-identified patent and that said Letters Patent are hereby corrected as shown below:

Assignee, delete "United-Carr Incorporated", add - - TRW Inc. - -.

Column 2, line 8, delete "contact", add - - constant - -.

Column 3, line 5, delete "zener".

Column 4, line 6, delete "48", add - - 58 - -.

Signed and sealed this 22nd day of February 1972.

(SEAL)
Attest:

EDWARD M.FLETCHER,JR.
Attesting Officer

ROBERT GOTTSCHALK
Commissioner of Patents